United States Patent [19]

Pedder

[11] Patent Number: 5,717,245

[45] Date of Patent: Feb. 10, 1998

[54] BALL GRID ARRAY ARRANGEMENT

[75] Inventor: David John Pedder, Warwickshire, United Kingdom

[73] Assignee: Plessey Semiconductors Limited, United Kingdom

[21] Appl. No.: 410,343

[22] Filed: Mar. 24, 1995

[30] Foreign Application Priority Data

Mar. 30, 1994 [GB] United Kingdom ............... 9406377

[51] Int. Cl.[6] .................................................. H01L 23/52
[52] U.S. Cl. ........................ 257/691; 257/780; 257/664; 257/698
[58] Field of Search ................................. 257/700, 664, 257/780, 781, 777, 691, 778, 779, 698; 333/219, 222, 203, 204, 205

[56] References Cited

U.S. PATENT DOCUMENTS

| | | | |
|---|---|---|---|
| 4,297,647 | 10/1981 | Akiyama et al. . | |
| 4,705,917 | 11/1987 | Gates, Jr. et al. | 257/700 |
| 4,811,082 | 3/1989 | Jacobs et al. | 257/777 |
| 4,890,155 | 12/1989 | Miyagawa et al. | 257/700 |
| 4,922,324 | 5/1990 | Sudo | 257/700 |
| 5,089,881 | 2/1992 | Panicker | 257/691 |
| 5,216,278 | 6/1993 | Lin et al. . | |
| 5,218,230 | 6/1993 | Tamamura et al. | 257/691 |
| 5,235,208 | 8/1993 | Katoh | 257/691 |
| 5,239,448 | 8/1993 | Perkins | 257/778 |
| 5,240,588 | 8/1993 | Uchida . | |
| 5,249,098 | 9/1993 | Rostoker et al. | 257/778 |
| 5,285,352 | 2/1994 | Pastore et al. . | |
| 5,309,024 | 5/1994 | Hirano | 257/786 |
| 5,355,283 | 10/1994 | Marrs et al. . | |
| 5,362,656 | 11/1994 | McMahon | 257/781 |
| 5,394,303 | 2/1995 | Yamaji | 257/777 |
| 5,468,999 | 11/1995 | Lin et al. | 257/700 |
| 5,490,324 | 2/1996 | Newman | 257/700 |

FOREIGN PATENT DOCUMENTS

| | | |
|---|---|---|
| 0 491 161 A | 6/1992 | European Pat. Off. . |
| 0 578 028 A | 1/1994 | European Pat. Off. . |
| 0 582 315 A | 2/1994 | European Pat. Off. . |

*Primary Examiner*—Mahshid D. Saadat
*Assistant Examiner*—S. V. Clark
*Attorney, Agent, or Firm*—Kirschstein, et al.

[57] ABSTRACT

A ball grid array arrangement comprises a dielectric multi-layer substrate, in a lower metallization layer of which is disposed an array of solder balls. A passive circuit element is integrated into at least one of the metallization layers. The arrangement may be either a discrete component consisting of a triplate transmission-line resonator or interdigitated filter integrated into an inner metallization layer and defined by that layer in conjunction with adjacent layers, or it may take the form of an IC carrier or multichip-module carrier having such transmission structures situated within a central die-attach area of the substrate and having also a peripheral area containing bonding structures for the mounting of at least one chip or chip module. There will normally be at least two groups of such bonding structures, and a passive circuit element in the form of an inductor may be formed in the upper metallization layer between adjacent groups of bonding structures.

5 Claims, 5 Drawing Sheets

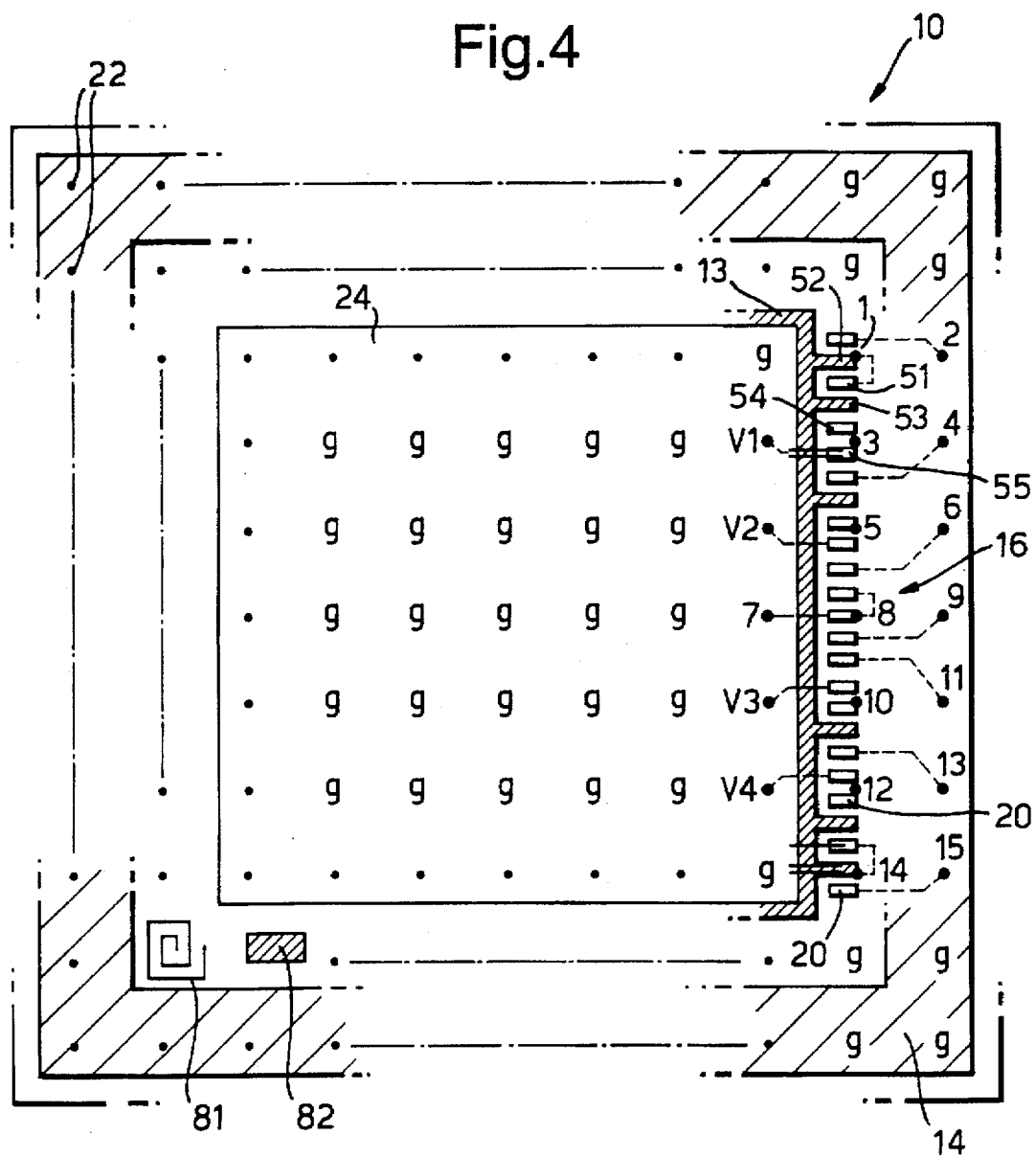

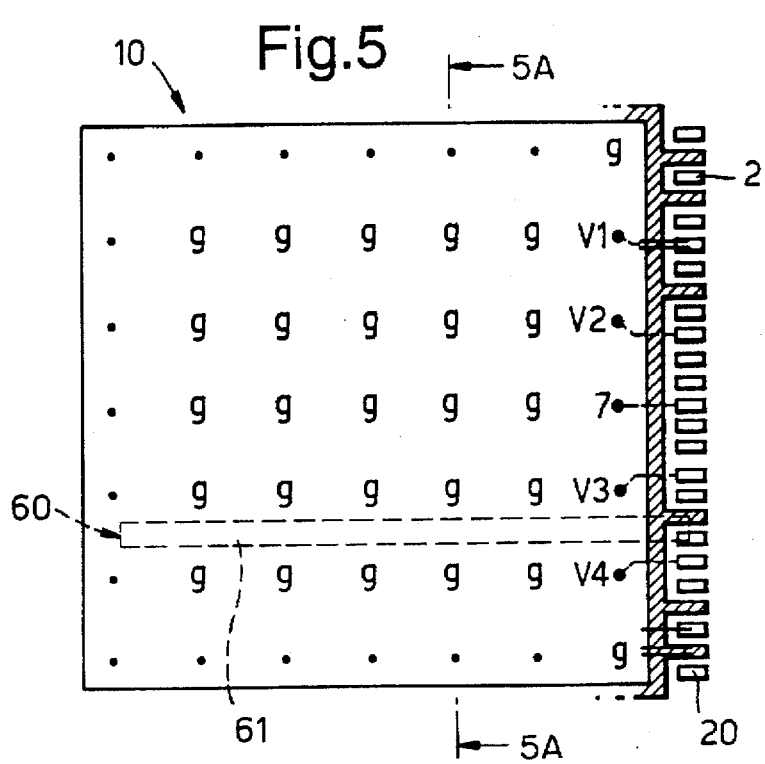
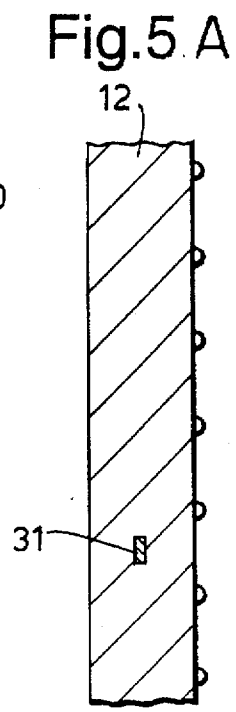
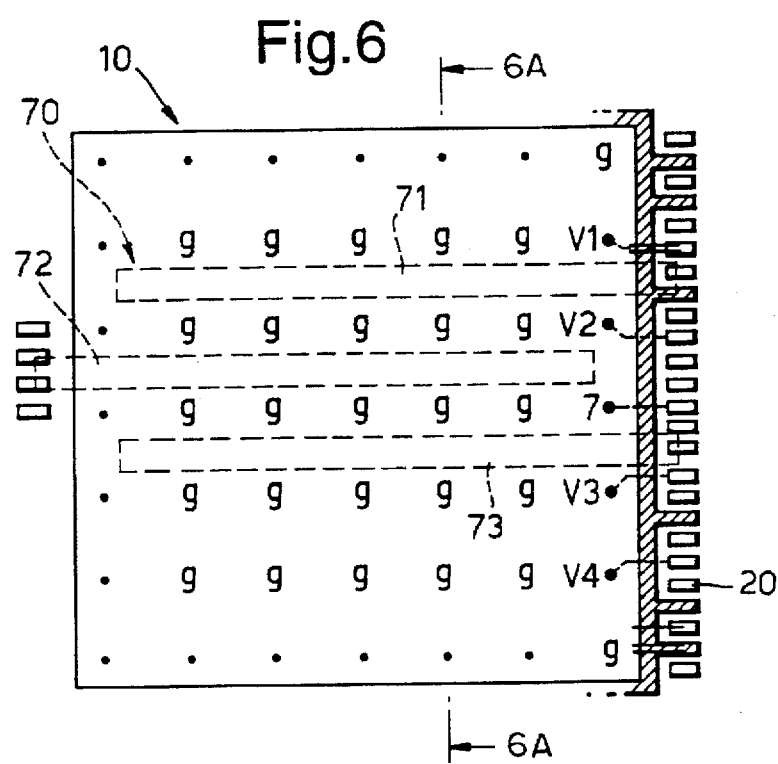
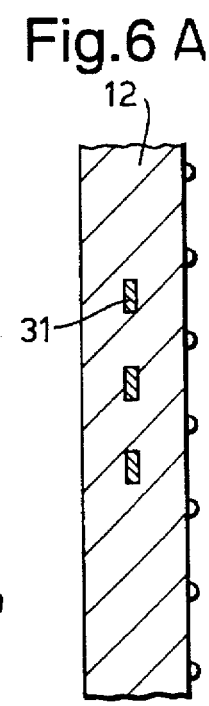

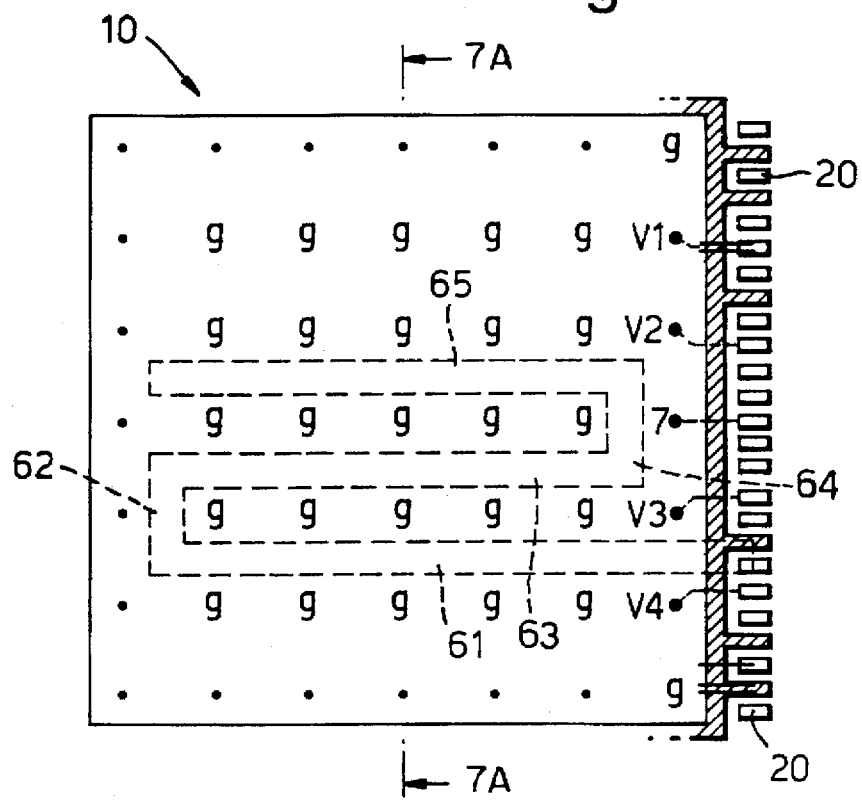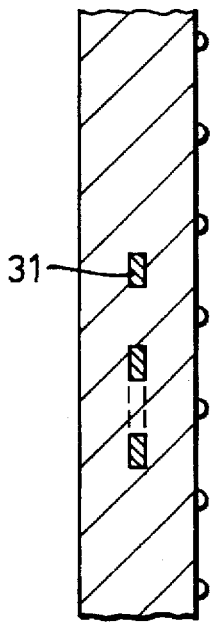

BALL GRID ARRAY ARRANGEMENT

BACKGROUND OF THE INVENTION

The invention concerns a ball grid arrangement and in particular, but not exclusively, a ball grid arrangement for enabling the connection of a multichip module to other circuitry.

There is a growing requirement, in the construction of very compact, low-cost radios and other rf communications circuits, for small, high performance and cost-effective package components.

In the case of radios and related products that employ mixed-technology silicon integrated circuit and GaAs monolithic microwave integrated circuit devices supported on multichip module MCM-D substrate structures incorporating integrated passive components, the very significant reduction in the physical size of the product in comparison with conventional surface-mount assemblies has led to a requirement to provide a large number of connections from the module package to the surrounding circuitry in a very compact package format. For example, some 120 signal, supply and ground connections may be required from a multichip module (MCM) assembly in which the substrate in only 10 mm square.

In addition, the high-frequency nature of these products demands highly effective grounding for the MCM-D substrate and its mounted microwave GaAs and high-speed silicon active devices, together with low-inductance supply connections and very short, low-inductance external signal connections. Further, a very high level of isolation is also commonly required between specific external package connections or ports.

There is also a need to be able to test an assembled multichip radio module.

Ball grid array (BGA) packaging arrangements exist which were developed to house high-speed (~50 MHz clock rate, or higher), high-pin-count, digital silicon ASICs (application-specific ICs) and related silicon IC devices within a compact package footprint. The BGA packages are constructed using a cofired ceramic technology with refractory metallisation systems (e.g. tungsten) and an alumina (or aluminium nitride) dielectric material, or by printed-circuit-board-like methods using plated copper metallisation with organic composite laminate materials. The package base supports an area array of solderable metallisation pads, each of which is provided with a solder ball connection. A multilayer package base construction is employed, with up to eight layers of metallisation and appropriate interlayer vias, to provide the dense routing demanded between the solder pad connections on the package base and rows of wire bond pads located on the upper surface of the package. A solderable seal ring metallisation may be provided around the perimeter of the package upper surface. The assembled package may then be completed by the sealing of a metallic lid structure or by encapsulation or moulding with a suitable fried or unfilled organic material.

It would be desirable to provide a ball grid array arrangement which satisfied one or more of the above-mentioned requirements and which also allowed the realisation of a discrete component as part of a ball grid array.

SUMMARY OF THE INVENTION

In accordance with a first aspect of the invention, there is provided a ball grid array arrangement including a dielectric multilayer substrate having an upper, a lower and at least one inner layer of metallisation, the lower metallisation layer including an array of solder balls, a passive circuit element being integrated into at least one of the metallisation layers.

Such an arrangement may be used purely as it stands as a discrete component realised as part of a ball grid array, or it may be used with other features, described below, to provide a device carrier incorporating a passive circuit element.

The passive circuit element may be a triplate line resonator transmission-line structure, or an interdigitated filter transmission-line structure formed in the at least one inner metallisation layer and defined by that layer in conjunction with adjacent metallisation layers and intervening dielectric layers.

The transmission-line structure may be terminated by a surface microstrip section formed in the upper or lower metallisation layer, the microstrip section serving to provide an exposed region of metallisation that can be selectively removed to trim the electrical response of the transmission-line structure. The use of a short surface microstrip section in this way allows the manufacturing tolerances that arise due to shrinkage in the dimensions of a ceramic substrate during co-firing to be corrected for.

Trimming of such a surface microstrip structure will normally be by laser, and in order to improve the optical absorption of the trimming structures for such an operation, a dielectric coating may be provided over the surface microstrip section.

The transmission-line structure may be formed between adjacent rows of solder balls, and one or more ground planes may be formed in at least one of the metallisation layers. Thus, the integrity of any through-vias which may be required to link one or more ground planes in the various layers may be maintained.

The substrate may comprise a central, die-attach area for the mounting of at least one chip or multichip module and a peripheral area containing bonding structures for establishing electrical connections between at least some of the solder balls and the at least one chip or multichip module.

The integration of a passive circuit element into such a BGA device-carrying arrangement has the advantage of allowing the characteristics of various circuitry within the chip or multichip module to be trimmed on the BGA arrangement itself, thereby permitting a degree of chip or module testing to be carried out before the BGA arrangement is made part of further circuitry.

The passive circuit element may be formed in the at least one inner metallisation layer within the central, die-attach area.

The peripheral area may include at least two groups of bonding structures, and the passive circuit element may be disposed in the peripheral area between adjacent groups of bonding structures. The passive circuit element may be an inductor, which may be defined in the upper metallisation layer. By integrating an inductor into the upper metallisation layer, advantage can be taken of the higher conductivity of that layer, vis-à-vis the inner layer or layers, to ensure a high Q-factor in the component, and of the increased spacing relative to the lower metallisation layer to ensure low stray capacitance and therefore high self-resonant frequency.

A capacitor may be mounted adjacent to the inductor for providing a tuning function for circuitry within the chip or chip module mounted to the ball grid array arrangement.

The ball grid array arrangement may include ground planes formed in the upper and lower metallisation layers in the central area, at least some of the solder balls in the lower metallisation layer in the central area being allocated as common ground connections for the ground planes.

The bonding structures in the peripheral area may be wire-bond pads formed in the upper metallisation layer, the pads being either signal pads or ground or power-supply pads, the pads being arranged so that at least some of the signal pads are each situated between ground or power supply pads.

A seal ring may be provided disposed around the outer part of the peripheral area, the seal ring serving as a sealing-cover bonding structure for bonding a sealing cover to the ball grid array arrangement. The seal ring may be arranged to be grounded by means of solder balls in the lower metallisation layer. Use of a sealing cover, which is preferably metal, has the advantage, firstly, of protecting the BGA package from the ingress of dirt and moisture, and secondly, where the lid is metallic, of electrically screening the device from RF interference.

The bonding structures may be disposed between the central ground plane in the upper metallisation layer and the peripheral seal ring.

Arranging for at least some of the signal-carrying wire-bond pads to be situated between pads which are at ground potential, or effectively at ground potential (i.e. power-supply pads) has the advantage of increasing the signal isolation between the signal pads.

According to a second aspect of the invention, there is provided a multichip module assembly including a ball grid array arrangement, as described above, and a multichip module mounted on the ball grid array arrangement.

According to a third aspect of the invention, there is provided a multichip module radio or communications device including a multichip module assembly as described above.

BRIEF DESCRIPTION OF THE DRAWINGS

The invention will now be described, by way of example only, with reference to the drawings, of which:

FIG. 4 shows parts of the arrangement of FIG. 1 in greater detail;

FIG. 5 shows the provision of a quarter wave triplate resonator in the inner metallisation layer of a ball grid array arrangement according to the invention;

FIG. 6 shows the provision of an interdigitated triplate filter in the inner metallisation layer of a ball grid array arrangement according to the invention;

FIG. 7 shows the provision of a quarter wave triplate resonator in the inner metallisation layer of a ball grid array arrangement according to the invention;

DETAILED DESCRIPTION OF THE INVENTION

Figure 1:
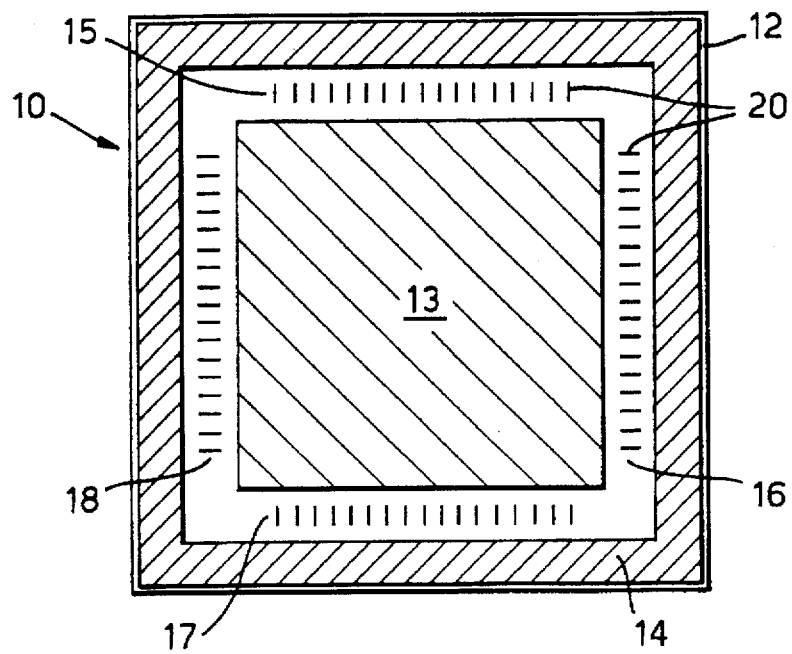
FIG. 1 is a simplified plan view of a ball grid array arrangement according to the invention.
Figure 2:
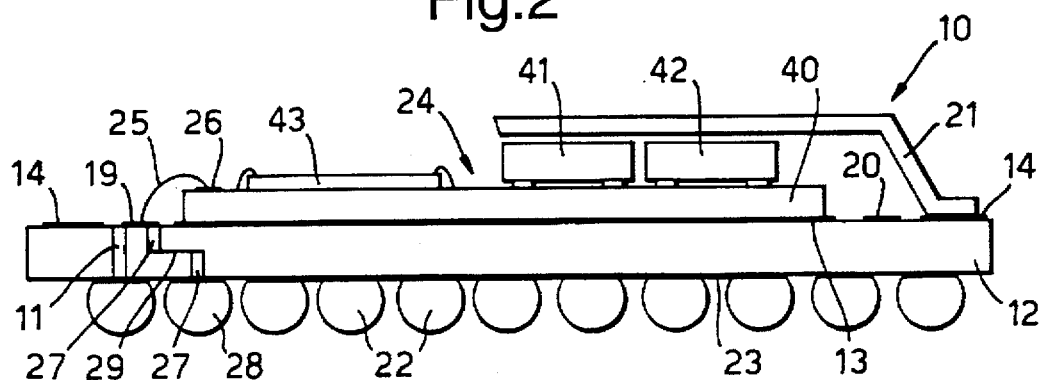
FIG. 2 is a side elevation of a multichip module assembly incorporating a ball grid array arrangement according to the invention.
Figure 3:
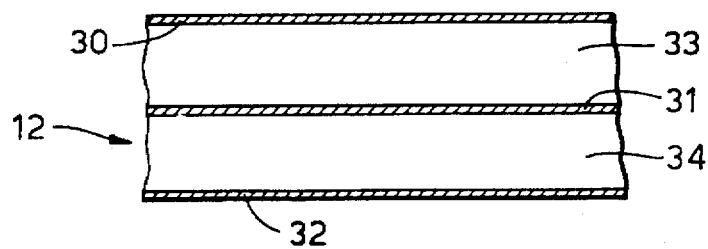
FIG. 3 is a cross-section of a substrate used in a ball grid array arrangement according to the invention.

Referring to FIGS. 1, 2 and 3, a simplified plan view of a ball grid array arrangement 10 according to a first embodiment of the invention is shown, comprising a multilayer substrate 12, which consists of three metallisation layers 30, 31, 32 and two intervening dielectric layers 33, 34. In the upper metallisation layer 30 are formed a central die-attach pad 13 forming a ground plane, a peripheral seal ring 14 and four groups 15–18 of wire-bond pads 20. A central pan of the lower metallisation layer likewise contains a ground plane. The substrate 12 is constructed using a cofired ceramic technology with refractory metallisation systems such as tungsten or molybdenum and an alumina (or aluminium nitride) dielectric material. In this process, the metallisation patterns are defined by screen-printing tungsten or molybdenum powder inks onto unfired $Al_2O_3$ layers in tape form. The tape comprises the powdered ceramic dielectric held together by an organic binder. When the patterns have been printed, the various layers of tape are laminated together and the resulting body fired at between 1650° and 1900° C. to remove the binders and to densify the structure.

The seal ring 14 allows an electrically conductive lid 21 to be bonded to the BGA, using either a gold-tin eutectic alloy composition or lower melting-point soft solder compositions, depending upon the thermal stability of the materials employed in the BGA package and the MCM.

The seal ring 14, the lower ground plane and the die-attach pad 13 are grounded by means of groups of solder balls 22 formed on the lower metallisation layer 32. Use of multiple solder balls in this way results in very low inductance grounding for the planes concerned. The wire-bond pads 20 are the means by which one or more chip dies or a multichip module (MCM) 24 is electrically connected to circuitry on a card (not shown) onto which the BGA package 10 is mounted. Thus, connections are made between the MCM 24 and the solder balls 22 by wire bonds 25, which link wire-bond pads 26 on the MCM 24 to corresponding wire-bond pads 25 on the BGA substrate 12, and by traces defined in the inner metallisation layer 31. Connections between the pads 20 and the inner metallisation layer 31 and between the inner metallisation layer 31 and the solder balls 22 are made by metal-filled vias 11 formed in the dielectric layers 33, 34. FIG. 2 shows one such connection between a pad 19 and a solder ball 28, the connection being made by means of two vias 27 and an inner trace 29.

The multichip module (MCM) 24 is a complete subcircuit incorporating a number of chips bonded to a substrate 40. FIG. 2 shows three such chips, namely two flip-chip silicon IC's 41, 42, which are bonded to the substrate 40 by way of solder bumps similar to, but of smaller scale than, the solder balls 22, and a GaAs chip 43 which is wire-bonded to the substrate 40.

A more detailed representation of the BGA package according to the invention is shown in plan view in FIG. 4. In FIG. 4, an MCM 24, which measures about 10 mm square, is shown mounted on the die attach pad 13 formed in the upper metallisation layer 30 of the BGA package 10. The BGA package 10 measures approximately 17 mm along each side, leaving approximately 3 mm each side for the wire-bond pads 20 and the seal ring 14. A large number (in this case, 121) of solder balls 22 is distributed throughout the lower metallisation layer 32 as an array, those occupying most of the central area beneath the MCM 24 being allocated to ground and shown designated as "g". The solder ball array is located on solderable metallisation pads, which, in the case of the cofired ceramic package employed in this embodiment, comprise tungsten pads coated with nickel and gold to ensure solderability. The solder balls are confined to the required locations over the lower grounded metallisation layer 32 by the selective deposition of the solderable nickelplus-gold finish over the otherwise unsolderable tungsten layer, or by the addition of a further, thin, ceramic coating finish over the areas that are not required to be solderable.

Outside the central area of the BGA package, i.e. in the peripheral area, in each corner of the package, are located a group 57 of solder balls 22 which serve to provide grounding connections for the seal ring 14. Grounding here ensures that a metal lid 21, which is bonded to the seal ring, will act as a electrical screen, helping to exclude RF interference from the circuitry on the MCM.

One group 16 only of wire-bond pads 20 is shown in FIG. 4, though it should be understood that there are four such groups in all situated along the four peripheral edge portions of the substrate 12. The wire-bond pads 20 are formed in the upper metallisation layer 30 and are disposed at a uniform pitch of 400 μm, there being 25 such pads in each group. The wire-bond pads on the substrate 40 of the attached MCM 24 may be spaced at a matching pitch to facilitate the use of short (less than 1 mm), parallel and low-inductance wire bonds between the MCM substrate 40 and the BGA package 10. Double or triple bonds may be employed on critical pads for lower inductance, where required.

The wire-bond pads 20 are allocated severally to signal functions and power/ground functions. Power for the MCM is taken from a row of solder balls along and inside each edge of the die attach pad 13. Only one such row is illustrated, containing four power inputs V1–V4, the other three such rows containing further inputs V5–V16. The inputs V1–V4 are fed to their respective wire-bond pads 20 by means of appropriate vias in the dielectric layers 33, 34 and traces in the inner metallisation layer 31, the latter being shown as dotted lines. The remaining wire-bond pads 20 are used as signal connections, and there are fifteen of these signal pads each side, i.e. sixty in all. The input signal connections are taken from the outer two peripheral rows of solder balls, i.e. from balls numbered 1–15, the links to the corresponding wire-bond pads being, as in the case of the power connections, by appropriate vias and inner traces.

The solder balls are arranged to be approximately 0.6 mm in diameter at an inter-ball pitch of 1.5 mm, approximately. Thus, using the power and signal feed arrangement shown in FIG. 4, whereby no pad 20 in the row 16 is linked to a solder ball further away than 1.5 mm, the power and signal connections are guaranteed to possess low resistance and self-inductance, which is essential where the MCM contains circuitry working at very high frequencies.

Most of the signal pads in the wire-bond group 16 (and in the other three groups) are arranged to be disposed between power or ground pads, the effect of this being to minimise crosstalk between signal connections. Thus, signal pad 51 is arranged to lie between a grounded pad 52 and a similar grounded pad 53, the pads 52 and 53 being extensions of the grounded die-attach pad 13. Likewise, signal pad 54 is located between grounded pad 53 and power-supply pad 55, which carries the power line V1. The same applies to most of the signal pads in the group, exceptions being the signal connections numbered 5–9 and 11.

It is also found that the local proximity of the grounded package base metallisation 23 (see FIG. 2) and the grounded seal ring structure 14 helps to shield the emerging signal trace connections and maximises isolation.

The bulk of the central area of the BGA package is employed almost exclusively for establishing ground connections with the external circuitry with which the MCM is associated, and therefore no inner-layer traces are required inside this area. The invention takes advantage of this to incorporate into the inner metallisation layer passive components which function as resonant or filter elements, or as tuning and adjusting elements for the circuitry in the MCM. One such component, shown in FIG. 5, is a quarter wavelength resonator, realised in triplate form. The resonator 60 consists of a strip 61 of inner metallisation 31 coupled by means of appropriate via routing to one or more wire-bond pads 20 at the, in this case, right-hand edge of the BGA package 10. The resonator relies for its operation on a transmission line effect that exists between the strip 61 and the parallel-lying upper and lower ground planes 13 and 23 (see FIG. 2), the three metallisation structures forming then what is known as a triplate structure. The alumina ceramic composing the substrate of the present embodiment has a relative permittivity, $\epsilon_r$, of approximately 9.8 at 2.4 GHz, which means that, if the resonator is to be a quarter-wave resonator at that frequency, it needs to be 10 mm in length. The line width for a 50 ohm impedance triplate structure in the 0.6 mm thick package base illustrated in FIG. 2 is about 0.3 mm. The resistance of such a line in a typical inner-layer tungsten metallisation having a resistance of 10 mΩ per square, is about 0.33 ohms. This resistance governs the Q-factor of the resonator.

The area occupied by the resonator 60 is conveniently restricted to those parts of the central area of the BGA package which lie between the solder balls 22, i.e. the strip 61 runs between adjacent rows of solder balls 22, and approximately parallel to them. The 50-ohm width of the resonator, i.e. nominally 0.3–0.4 mm, fits comfortably within the inter-ball pitch, which is approximately 1.5 mm.

Another passive element that may be incorporated into the substrate in the central area is an interdigitated triplate filter. Such a filter structure, which may be employed as a transmit and/or receive chain band-pass filter, for example, is illustrated in FIG. 6. In FIG. 6, a filter 70 consists of three quarter-wavelength strips 71–73 of inner metallisation 31, each having a width and length similar to that of the resonator 60 in FIG. 5 to achieve a 50-ohm impedance, and each co-operating with neighbouring upper and lower metallisation layers to form a triplate transmission line system as in the case of the resonator 60. Again, connections to one end of each of the strips 71–73 are made by way of vias and, where necessary, further traces linking with the wire-bond pads 20, but this time connections are taken from opposite sides of the BGA package 10. Thus, the outer strips 71, 73 are fed from, in this case, the right-hand side of the BGA package, while the centre strip 72 is fed from the left-hand side. Filter tap points may also be placed along the length of the outer filter elements according to the specific design required.

Because a cofired ceramic fabrication process is employed for the BGA package 10 in this embodiment, the dimensional instability inherent in the firing process must be taken into account the dimensions of the resonator or filter elements are calculated. This instability takes the form of shrinkage, typically 16% in linear dimensions with a tolerance of ±0.5%. These tolerances lead to similar tolerances in the electrical characteristics of the resonator or filter employed, i.e. its resonant frequency and bandpass characteristics, respectively. In order to achieve tighter tolerances, a combination of triplate and surface microstrip constructions (not shown) are employed to allow trimming and tuning of these components after manufacture. This is realised by arranging for the majority of the length of a resonator or filter element to be defined in the triplate format described above, but completing the length with the addition of a short length of microstrip formed in the upper or lower metallisation 30, 32. This measure takes part of the element onto the package surface, where laser or abrasive trimming may be employed to adjust the length and resonant behaviour of the line. Care must, however, be taken to ensure that there is minimal discontinuity in the transition between the two formats.

In a second embodiment of a BGA arrangement according to the invention, a PCB-type construction of the substrate is used, rather than a co fired ceramic construction. This employs plated copper metallisation bonded to organic composite laminate materials. Gold wire bonding alone is employed here, in contrast to the gold or aluminium bonding which may be used in the ceramic type of construction. The PCB-type system has the disadvantage that the polymeric materials employed are not as dimensionally stable as the ceramic materials. There is also the fact that alumina ceramic materials can be selected which have very low dielectric loss at the frequencies of interest, whereas dielectric losses in the polymeric materials are likely to be somewhat higher, depending on the level of additives, e.g. fire retardants, incorporated into the laminates involved.

On the positive side, however, the PCB-type construction does have the advantage that, since photolithographic methods can be employed to form the necessary metallisation patterns, these patterns and hence their dimensions can be very accurately controlled.

There is also the advantage that, in such a type of construction, a higher Q-factor may be achieved in the resonator/filter elements incorporated into the body of the BGA package. This is because, firstly, copper is used for the metallisation rather than tungsten, copper having a lower resistivity, and secondly, greater thicknesses of metallisation can be employed in the PCB type of construction than in its ceramic counterpart.

A further difference between the two techniques is that, in the case of the PCB-type construction, the organic polymeric materials used for the substrate have a low dielectric constant. This impinges on the design of a resonator or filter incorporated into the BGA package, and means that both the line width for a 50 ohm impedance and the length of the resonant line has to be increased relative to the cofired substrate case. The increase is of the order of 40%. Because of this, it may be necessary, in a PCB-type construction, to fold the resonator 60 in the plane of the inner metallisation. One such folding arrangement is shown in FIG. 7, the folded sections being sections 62–65. Again, each of the sections lies, like the single section 61 in FIG. 5, between adjacent rows of solder balls 22. In practice, it may be necessary to widen the distance between the sections in order to avoid unwanted coupling between the turns of the folded structure. This is easily achieved by lengthening the linking sections 62 and 64 and running the parallel sections 63, 65 between more distant rows relative to the section 61.

The above technique of folding the resonator is not restricted solely to the PCB-based arrangement, but may be employed in either construction whenever the length of a resonator or filter element needs to be longer than the central area occupied by the grounded solder balls, for example, because half-wave elements are to be used.

The BGA arrangement according to the invention also provides for passive components to be incorporated in the peripheral area, in contrast with the central area. The most convenient part of the substrate for this is that part lying between adjacent groups of wire-bond pads 15–18 (see FIG. 1). This is illustrated in greater detail in FIG. 4, in which a spiral inductor 75 is shown in the bottom left-hand corner of the package 10. The inductor 75 is conveniently formed in the upper metallisation layer so as to allow maximum spacing between the inductor and the nearby ground plane in the lower metallisation layer, thereby minimising capacitance to ground and maximising the self-resonant frequency of the component. The upper metallisation layer also offers the lowest resistivity in the ceramic construction, since the exposed tungsten metallisation may be overplated with nickel and gold. This, in turn, leads to low inductor resistance and maximum Q-factor.

The inductor 75 may be defined within a 1.2 mm footprint, offering inductance values of up to 11 nH, with Q-factors peaking at between 40 and 80 at around 1 GHz. Such inductors are of particular interest in IF circuitry. A small, laser-trimmable ceramic capacitor 76 may also be mounted adjacent to the inductor 75 to allow, in conjunction with the inductor 75, the tuning of oscillator circuits within the MCM. The capacitor 76 shown is an 0402 surface-mount component having dimensions 1 mm×0.5 mm.

Both inductor 75 and capacitor 76 are taken to wire-bond pads 20 and/or solder balls 22 by means of appropriate vias and metallisation traces (not shown).

Figure 8:
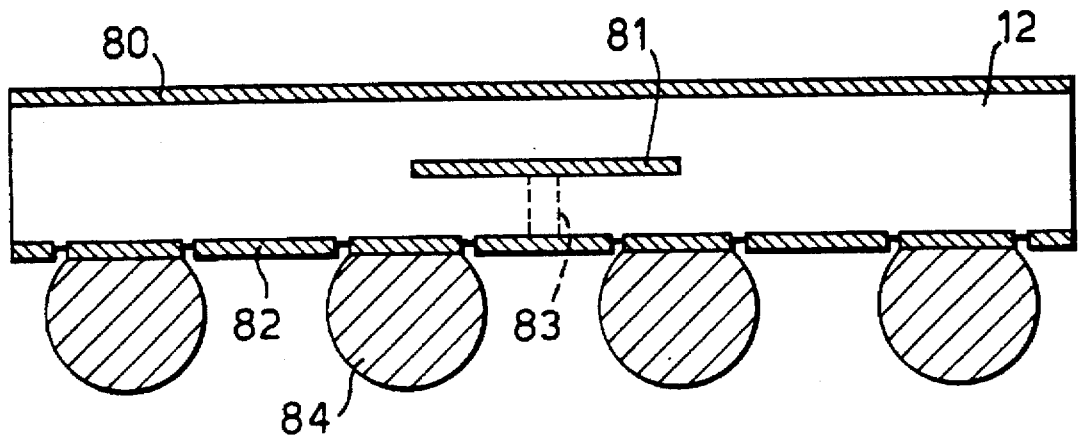
FIG. 8 is a side section of a discrete ball grid array resonator according to the invention.
Figure 9:
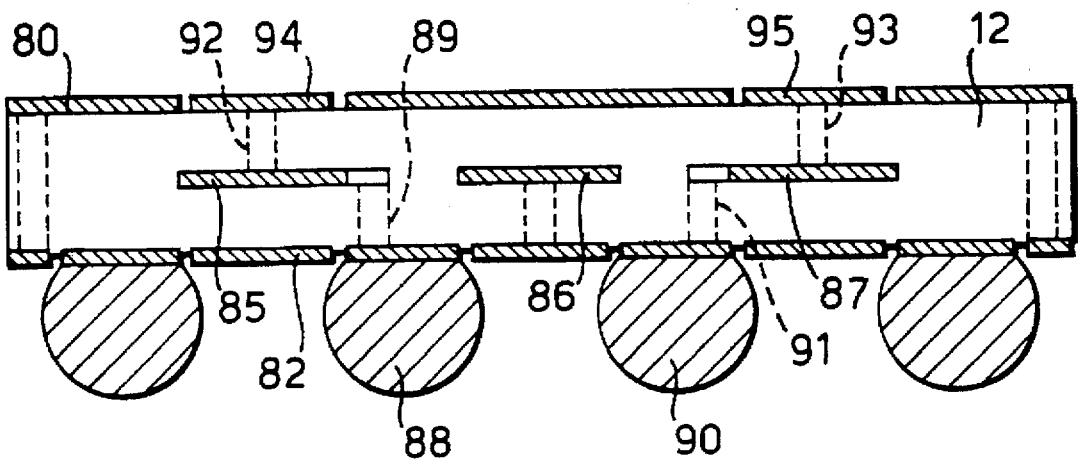
FIG. 9 is a side section of a discrete ball grid array filter according to the invention.

As well as providing a ball grid array device-carrying arrangement, the invention also provides a ball grid array discrete-component arrangement. Two such discrete-component arrangements are shown in FIGS. 8 and 9. In FIG. 8, a three-layer substrate 12 is provided with an upper ground plane 80 and a lower ground plane 82. A line resonator 81 is formed in the inner metallisation, a connection being made between the resonator 81 and external circuitry by means of a via 83. The external circuitry interfaces with the BGA resonator by way of the solder bumps 84. The same criteria regarding line length and width, line resistance, etc, apply to this discrete resonator as applied to the corresponding resonator in the BGA device-carrying arrangement of FIG. 5.

A discrete interdigitated filter component is shown in FIG. 9. In FIG. 9, the same three-layer substrate 12 is employed, comprising the upper and lower grounds 80, 82, but this time, analogous to the arrangement of FIG. 6, three quarter-wave lines 85, 86, 87 are formed in the inner metallisation layer. The input and output feed connections are situated on the outermost lines of the set, thus one end of line 85 is taken to a solder bump 88 by means of a via 89 and one end of line 87 to solder bump 90 by means of a via 91. The other ends of the lines 85, 87 are taken by way of vias 92, 93, respectively, to respective microstrip trimming stubs 94, 95 formed in the upper metallisation layer. The areas of the surface stubs 94, 95 which are to be trimmed may be coated with a suitable dielectric (in the case of a co-fired structure, an alumina coating may be used) to improve the absorption of the trimming laser radiation.

As an alternative arrangement for the quarter-wave filter structures of FIGS. 6 and 9, three half-wavelength coupled lines may be employed fed from adjacent quarter-wave structures. These structures may be folded, in the manner of FIG. 7, to keep them within the available area and to optimise the position of vias to the external BGA connections.

Appropriate via structures are incorporated into the discrete arrangements of FIGS. 8 and 9 in order to provide the necessary connections between the solder balls 84 and the resonator or filter structures, as already mentioned, and also between the various ground planes in the upper and lower metallisation layers. Other arrangements are possible involving the use of more than three metallisation layers, and where such are used, the triplate structures hereinbefore described may be formed in three adjacent inner layers instead of in the two outer layers and one inner layer. Suitable via structures will then be necessary to link pans of these additional layers with each other and with the outer layers and the solder balls, as necessary.

I claim:

1. A ball grid array package structure, comprising: a multilayer dielectric/metallization substrate having an upper surface and a lower surface, and a regular array of solder balls formed on said lower surface, said structure including an upper, a lower and at least one intermediate metallization layer, said upper metallization layer defining at least one device attachment metallization area disposed centrally on said upper surface, and a plurality of bond attachment metallization areas disposed peripherally around said device attachment area, a transmission line structure being defined between said intermediate metallization layer and at least one of said upper and lower metallization layers, and said lower metallization layer defining a ground metallization area on said lower surface on which ground metallization area a plurality of said solder balls are formed, and a plurality of interconnection areas on each of which at least a respective one of said solder balls is formed, and a plurality of vias formed through said structure and electrically interconnecting respectively said device attachment area with said ground metallization area and respective ones of said bond attachment areas with said interconnection areas.

2. A ball grid array package structure, comprising: a multilayer dielectric/metallization substrate having an upper surface and a lower surface, and a regular array of solder balls formed on said lower surface, said structure including an upper, a lower and at least one intermediate metallization layer, said upper metallization layer defining at least one device attachment metallization area disposed centrally on said upper surface, and a plurality of bond attachment metallization areas disposed peripherally around said device attachment area, at least one resonant line structure being defined between said intermediate metallization layer and at least one of said upper and lower metallization layers, and said lower metallization layer defining a ground metallization area on said lower surface on which ground metallization area a plurality of said solder balls are formed, and a plurality of interconnection areas on each of which at least a respective one of said solder balls is formed, and a plurality of vias formed through said structure and electrically interconnecting respectively said device attachment area with said ground metallization area and respective ones of said bond attachment areas with said interconnection areas.

3. The ball grid array package structure in accordance with claim 2, wherein the resonant line structure is defined between said intermediate metallization layer and said upper metallization layer, and said resonant line structure includes at least one length of trimmable strip line defined in said upper metallization layer.

4. The ball grid array package structure in accordance with claim 3, wherein a dielectric coating is provided over said length of trimmable strip line to improve optical absorption for laser trimming.

5. The ball grid array package structure in accordance with claim 1, wherein said upper metallization layer also defines a seal ring disposed about the periphery of said upper surface of the substrate, and means including at least one of said vias to interconnect said seal ring and said ground metallization area.

* * * * *